United States Patent
Hu et al.

(10) Patent No.: US 8,835,753 B2
(45) Date of Patent: Sep. 16, 2014

(54) SOLAR CELL AND METHOD OF FABRICATING THE SAME

(75) Inventors: Yen-Cheng Hu, Hsin-Chu (TW);
Hsin-Feng Li, Hsin-Chu (TW);
Zhen-Cheng Wu, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 274 days.

(21) Appl. No.: 13/101,996

(22) Filed: May 5, 2011

(65) Prior Publication Data

US 2012/0167966 A1   Jul. 5, 2012

(30) Foreign Application Priority Data

Dec. 30, 2010   (TW) .............................. 99147033 A

(51) Int. Cl.
*H01L 31/036* (2006.01)
*H01L 31/0392* (2006.01)
*H01L 31/18* (2006.01)
*H01L 31/0747* (2012.01)
*H01L 31/0368* (2006.01)
*H01L 31/068* (2012.01)

(52) U.S. Cl.
CPC ......... *H01L 31/03685* (2013.01); *Y02E 10/547* (2013.01); *Y02E 10/545* (2013.01); *Y02E 10/548* (2013.01); *H01L 31/1824* (2013.01); *H01L 31/0747* (2013.01); *H01L 31/068* (2013.01)
USPC ........... 136/255; 136/258; 136/256; 136/261; 438/87; 438/89; 438/98

(58) Field of Classification Search
USPC ................. 136/244–265; 438/57–98
See application file for complete search history.

(56) References Cited

U.S. PATENT DOCUMENTS

| | | |
|---|---|---|
| 5,217,539 A | 6/1993 | Fraas |
| 5,597,741 A | 1/1997 | Sakamoto |
| 7,888,160 B2 | 2/2011 | Shen |
| 8,093,675 B2 * | 1/2012 | Tsunemi et al. |
| 8,354,585 B2 * | 1/2013 | Oh et al. ............. 136/256 |
| 2004/0112426 A1 * | 6/2004 | Hagino ............. 136/261 |
| 2007/0256728 A1 | 11/2007 | Cousins |
| 2008/0061293 A1 * | 3/2008 | Ribeyron et al. ........ 257/53 |
| 2009/0183772 A1 * | 7/2009 | Joo et al. ............. 136/258 |
| 2009/0301549 A1 * | 12/2009 | Moslehi ............. 136/251 |
| 2010/0089435 A1 * | 4/2010 | Lockenhoff |
| 2010/0126569 A1 | 5/2010 | Oh |

FOREIGN PATENT DOCUMENTS

TW          201003934         1/2010

* cited by examiner

*Primary Examiner* — Jayne Mershon
(74) *Attorney, Agent, or Firm* — Winston Hsu; Scott Margo

(57) ABSTRACT

A solar cell includes a semiconductor base, a first doped semiconductor layer, an insulating layer, a second doped semiconductor layer and a first electrode layer. The semiconductor base has a first doped type. The first doped semiconductor layer, disposed on the semiconductor base, has a doped contact region. The insulating layer is disposed on the first doped semiconductor layer, exposing the doped contact region. The second doped semiconductor layer is disposed on the insulating layer and the doped contact region. The first doped semiconductor layer, the doped contact region and the second doped semiconductor layer have a second doped type, and a dopant concentration of the second doped semiconductor layer is between that of the first doped semiconductor layer and that of the doped contact region. The first electrode layer is disposed corresponding to the doped contact region.

17 Claims, 9 Drawing Sheets

SOLAR CELL AND METHOD OF FABRICATING THE SAME

BACKGROUND OF THE DISCLOSURE

1. Technology Field

The present disclosure is related to a solar cell and a method of fabricating the same, and more particularly, to the solar cell having high photo-electric conversion efficiency and high absorption ratio of the short-wavelength visible-light, and the method of fabricating the same.

2. Description of the Prior Art

Presently, the main energy resource for people to use is petroleum. Because of the limited amount of petroleum, the demand for substitute energy sources increases with times, and among all kinds of substitute energy sources, the most potential one is solar energy.

However, the development of conventional solar cell is restricted by its low absorption ratio of short-wavelength visible-light, high interface traps density (Dit) and high contact resistance. The restrictions of the conventional solar cell constrain the improvement of photo-electric (or namely power) conversion efficiency, and adversely affect the progress of solar cell.

SUMMARY OF THE DISCLOSURE

It is therefore one of the objectives of the present disclosure to provide a solar cell and a method of fabricating the same to improve photo-electric (or namely power) conversion efficiency.

An exemplary embodiment of the present disclosure provides a solar cell. The solar cell includes a semiconductor base, a first doped semiconductor layer, an insulating layer, a second doped semiconductor layer and a first electrode layer. The semiconductor base has a first surface and a second surface, and the semiconductor base has a first doped type. The first doped semiconductor layer is disposed on the first surface of the semiconductor base, in which the first doped semiconductor layer includes at least one doped contact region, the first doped semiconductor layer and the at least one doped contact region have a second doped type contrary to the first doped type, and a dopant concentration of the at least one doped contact region is substantially higher than a dopant concentration of the first doped semiconductor layer. The insulating layer is disposed on the first doped semiconductor layer, in which the insulating layer has at least one opening exposing the at least one doped contact region. The second doped semiconductor layer is disposed on the insulating layer and the at least one doped contact region, in which the second doped semiconductor layer has the second doped type, and a dopant concentration of the second doped semiconductor layer is substantially between the dopant concentration of the at least one doped contact region and the dopant concentration of the first doped semiconductor layer. The first electrode layer is disposed on the second doped semiconductor layer, and the first electrode layer is corresponding to the at least one doped contact region.

Another exemplary embodiment of the present disclosure provides a method of forming a solar cell including the following steps. A semiconductor base having a first doped type is provided. A first doped semiconductor layer is formed on a first surface of the semiconductor base, and the first doped semiconductor layer has a second doped type contrary to the first doped type. An insulating layer is formed on the first doped semiconductor layer, and the insulating layer has at least one opening to partially expose the first doped semiconductor layer. A second doped semiconductor layer is formed on the insulating layer and the first doped semiconductor layer exposed by the at least one opening of the insulating layer, the second doped semiconductor layer has the second doped type, and a dopant concentration of the second doped semiconductor layer is substantially higher than a dopant concentration of the first doped semiconductor layer. An annealing process is performed to diffuse the dopant of the second doped semiconductor layer downward to form at least one doped contact region in the first doped semiconductor layer exposed by the at least one opening of the insulating layer, the at least one doped contact region has the second doped type, a dopant concentration of the at least one doped contact region is substantially higher than the dopant concentration of the first doped semiconductor layer and the dopant concentration of the second doped semiconductor layer. A first electrode layer corresponding to the at least one doped contact region is formed on the second doped semiconductor layer.

These and other objectives of the present disclosure will no doubt become obvious to those of ordinary skill in the art after reading the following detailed description of the preferred embodiment that is illustrated in the various figures and drawings.

DETAILED DESCRIPTION

To provide a better understanding of the present disclosure, preferred embodiments will be made in detail. The preferred embodiments of the present disclosure are illustrated in the accompanying drawings with numbered elements.

Figure 1:
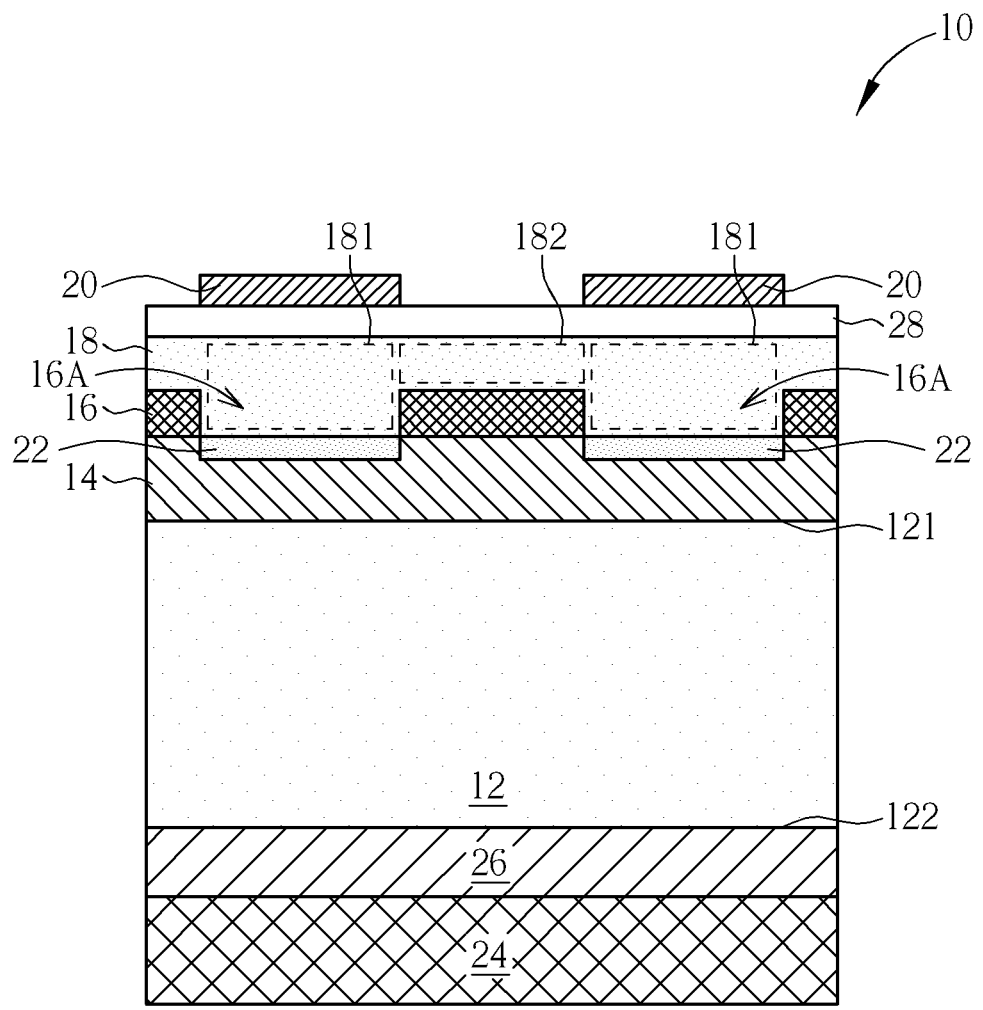
FIG. 1 illustrates a schematic diagram of a solar cell according to a first exemplary embodiment of the present disclosure.

Please refer to FIG. 1. FIG. 1 illustrates a schematic diagram of a solar cell according to a first exemplary embodiment of the present disclosure. As shown in FIG. 1, the solar cell 10 of the exemplary embodiment includes a semiconductor base 12, a first doped semiconductor layer 14, an insulating layer 16, a second doped semiconductor layer 18 and a first electrode layer 20. The semiconductor base 12 has a first surface 121 and a second surface 122, and the semiconductor base 12 has a first doped type. The semiconductor base 12 could be a crystalline silicon base such as a single crystalline silicon base or a poly crystalline silicon base, but not limited thereto. The first doped semiconductor layer 14 is disposed on the first surface 121 of the semiconductor base 12, and the first doped semiconductor layer 14 includes at least one doped contact region 22. The first doped semiconductor layer 14 and the at least one doped contact region 22 have the same crystalline type as the semiconductor base 12, in other words, the first doped semiconductor layer 14 and the at least one doped contact region 22 are made of crystalline silicon such as single crystalline silicon or poly crystalline silicon. Furthermore, the first doped semiconductor layer 14 and the at least one doped contact region 22 have a second doped type contrary to the first doped type, accordingly, a depletion region due to a PN junction may form in the interface between the semiconductor base 12 and the first doped semiconductor layer 14. Also, the dopant concentration of the at least one doped contact region 22 is substantially higher than (or namely substantially greater than) the dopant concentration of the first doped semiconductor layer 14. In this exemplary embodiment, the first doped type can be P type, while the second doped type is N type, but not limited thereto, that is, the first doped type can also be N type, while the second doped type is P type. The insulating layer 16 is disposed on the first doped semiconductor layer 14, and the insulating layer 16 has at least one opening 16A, which exposes the at least one doped contact region 22. The insulating layer 16 has protection function for it is capable of depressing generation of interface traps between the first doped semiconductor layer 14 and the semiconductor base 12 below the insulating layer 16, and further reducing the recombination of electron-hole pairs. The insulating layer 16 may be a single-layered structure or a multi-layered structure, and may selectively include at least one of the following materials: inorganic materials such as a silicon nitride layer, silicon oxide, silicon oxynitride or other proper inorganic materials; organic materials such as polyimide (PI), poly-methacrylate (PMA), photo-resist, polyvinylalcohol (PVA), polyvinylpyrrolidone (PVP), poly (vinyl phenol) (PVPh), other proper organic materials or copolymer of materials illustrated above. In this exemplary embodiment, the insulating layer 16 is preferably made of inorganic material, but not limited thereto. The second doped semiconductor layer 18 is disposed on the insulating layer 16 and the at least one doped contact region 22, in which the second doped semiconductor layer 18 has the second doped type, and the dopant concentration of the second doped semiconductor layer 18 is substantially between the dopant concentration of the at least one doped contact region 22 and the dopant concentration of the first doped semiconductor layer 14.

In this exemplary embodiment, the second doped semiconductor layer 18 includes a first region 181 and a second region 182. The first region 181 is corresponding to the at least one doped contact region 22 of the first doped semiconductor layer 14, the second region 182 is corresponding to the insulating layer 16, the grain size of the second doped semiconductor layer 18 in the first region 181 is substantially different from the grain size of the second doped semiconductor layer 18 in the second region 182, while the crystalline type of the second doped semiconductor layer 18 in the first region 181 and the crystalline type of the second doped semiconductor layer 18 in the second region 182 may be substantially the same or different. For instance, the second doped semiconductor layer 18 in the first region 181 and the second doped semiconductor layer 18 in the second region 182 could be both made of amorphous silicon, nanocrystalline silicon or microcrystalline silicon, but have substantially different grain sizes. For example, the second doped semiconductor layer 18 in the first region 181 and the second doped semiconductor layer 18 in the second region 182 could have substantially the same crystalline type such as amorphous silicon, however, the grain size of the second doped semiconductor layer 18 in the first region 181 may be substantially larger than (or namely substantially greater than) the grain size of the second doped semiconductor layer 18 in the second region 182; or the second doped semiconductor layer 18 in the first region 181 and the second doped semiconductor layer 18 in the second region 182 could be both made of nanocrystalline silicon substantially, however, the grain size of the second doped semiconductor layer 18 in the first region 181 is substantially larger than the grain size of the second doped semiconductor layer 18 in the second region 182; or the second doped semiconductor layer 18 in the first region 181 and the second doped semiconductor layer 18 in the second region 182 could be both made of microcrystalline silicon substantially, however, the grain size of the second doped semiconductor layer 18 in the first region 181 is substantially larger than the grain size of the second doped semiconductor layer 18 in the second region 182. Alternatively, the second doped semiconductor layer 18 in the first region 181 and the second doped semiconductor layer 18 in the second region 182 could have substantially different crystalline types, and the grain size of the second doped semiconductor layer 18 in the first region 181 is substantially larger than the grain size of the second doped semiconductor layer 18 in the second region 182. For instance, the second doped semiconductor layer 18 in the first region 181 can be made of nanocrystalline silicon, while the second doped semiconductor layer 18 in the second region 182 can be made of amorphous silicon; or the second doped semiconductor layer 18 in the first region 181 can be made of microcrystalline silicon, while the second doped semiconductor layer 18 in the second region 182 can be made of amorphous silicon or nanocrystalline silicon. Because the dopant concentration of the at least one doped contact region 22 is substantially higher than (or namely substantially greater than) the dopant concentration of the first doped semiconductor layer 14 and the dopant concentration of the second doped semiconductor layer 18, the at least one doped contact region 22 may provide lower resistance for reducing a contact resistance between the first doped semiconductor layer 14 and the second doped semiconductor layer 18. Furthermore, when the grain size of the second doped semiconductor layer 18 in the first region 181 is substantially larger than the grain size of the second doped semiconductor layer 18 in the second region 182, the second doped semiconductor layer 18 in the first region 181 has a better carrier delivering efficiency. Accordingly, the at least one doped contact region 22 and the second doped semiconductor layer 18 in the first region 181 can serve as a selective emitter for improving the photo-electric (or namely power) conversion efficiency of the solar cell 10.

The absorption ratio of visible-light having wavelength substantially between 400 nanometer (nm) and 700 nm of the second doped semiconductor layer 18 is substantially between 20% and 100%. In other words, the second doped semiconductor layer 18 has a high absorption ratio and a low reflective index with respect to short-wavelength visible-light, accordingly, the second doped semiconductor layer 18 is favorable for increasing a current density of the solar cell 10. The first electrode layer 20 is disposed on the second doped semiconductor layer 18, and the first electrode layer 20 is corresponding to the at least one doped contact region 22. The first electrode layer 20 may include any kinds of material with good conductivity such as silver (Ag), aurum (Au), copper (Cu), aluminum (Al), titanium (Ti), tantalum (Ta), molybdenum (Mo), other proper materials or alloy thereof.

In addition, the solar cell 10 may further include a second electrode layer 24 disposed on the second surface 122 of the semiconductor base 12. Furthermore, a back side field (BSF) structure 26 may be selectively disposed between the second electrode layer 24 and the semiconductor base 12. The second electrode layer 24 may be made of any kinds of material with good conductivity such as aluminum (Al), silver (Ag), aurum (Au), copper (Cu), tantalum (Ta), molybdenum (Mo), other proper materials or alloy thereof. The back side field structure 26 may be a single-layered structure or a multi-layered structure, and the material of the back side field structure 26 may include metal silicide, metal oxide, other proper materials or combination thereof. The back side field structure 26 is preferably made of metal silicide, but not limited thereto. Furthermore, the solar cell 10 may further include a protective layer 28 disposed between the second doped semiconductor layer 18 and the first electrode layer 20. Preferably, the protective layer 28 is covering on the second doped semiconductor layer 18. The protective layer 28 may be a single-layered structure or a multi-layered structure, and the material of the protective layer 28 may include insulating material, transparent conducting material, anti-reflective material, or combination thereof. In this exemplary embodiment, the protective layer 28 is a transparent conducting layer, the material of this protective layer 28 may include, but not limited thereto, indium tin oxide (ITO), indium zinc oxide (IZO), aluminum oxide, aluminum zinc oxide (AZO), etc. The protective layer 28 could further possess the anti-reflective capability for increasing the amount of incident light. What is more, each layer of the solar cell 10 may include a textured surface for further increasing the amount of incident light.

The solar cell of the present disclosure is not constrained to the exemplary embodiment illustrated previously. The following paragraphs would detail the solar cell and the methods of forming the same according to other exemplary embodiments of the present disclosure. In the following exemplary embodiment, the same components are denoted by the same numerals, and only the differences are discussed while the similarities are omitted.

Figure 2:
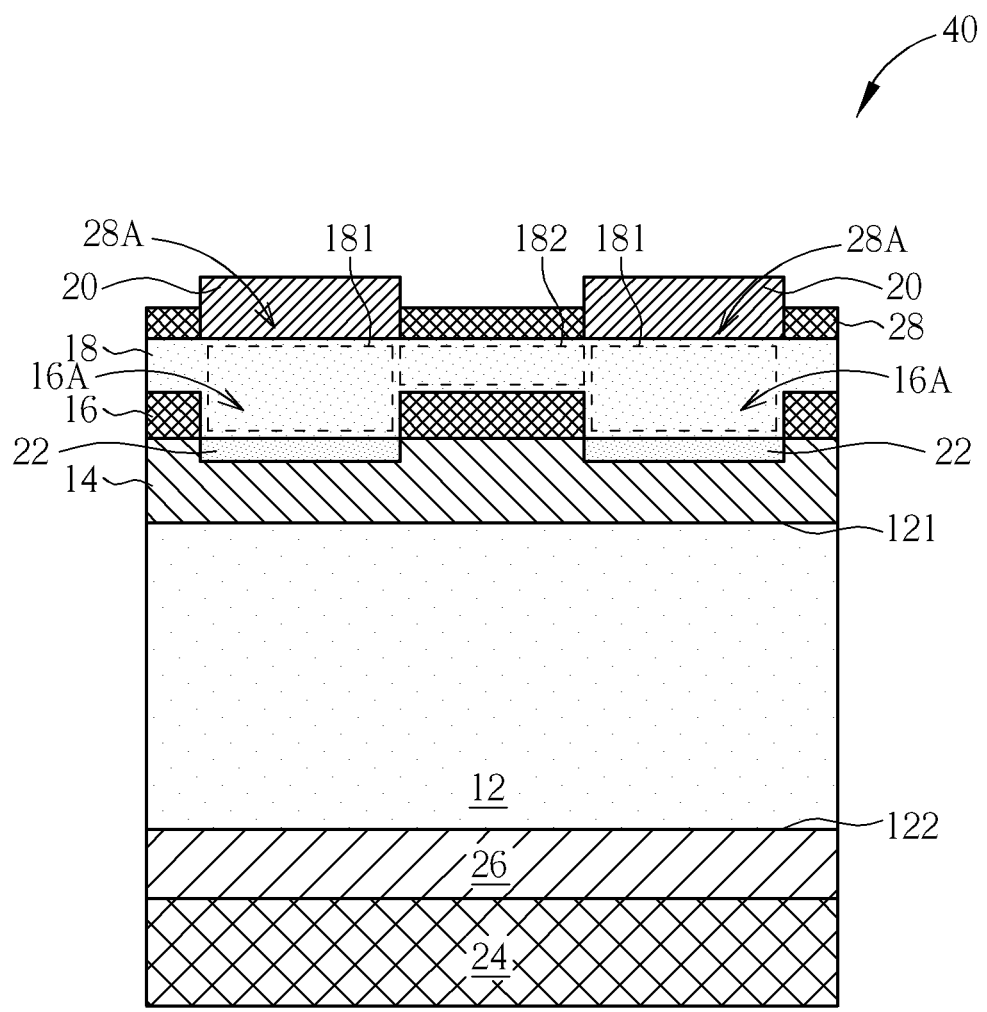
FIG. 2 illustrates a schematic diagram of a solar cell according to a second exemplary embodiment of the present disclosure.

Please refer to FIG. 2. FIG. 2 illustrates a schematic diagram of a solar cell according to a second exemplary embodiment of the present disclosure. As shown in FIG. 2, different from the first exemplary embodiment, in this exemplary embodiment, the protective layer 28 of a solar cell 40 is an insulating layer, and the protective layer 28 has at least one opening 28A, which exposes the first electrode layer 20. The protective layer 28 may be a single-layered structure or a multi-layered structure, and the material of the protective layer 28 could selectively include at least one of the following materials: inorganic materials (e.g. silicon nitride, silicon oxide, silicon oxynitride and other proper inorganic materials); organic materials (e.g. polyimide (PI), poly-methacrylate (PMA), photo-resists, polyvinylalcohol (PVA), polyvinylpyrrolidone (PVP), poly(vinyl phenol) (PVPh)), other proper organic materials or copolymer of materials illustrated above. The protective layer 28 of this exemplary embodiment is preferably made of inorganic materials, but not limited thereto. Additionally, the protective layer 28 could further possess the anti-reflective capability for increasing the amount of incident light.

Figure 3:
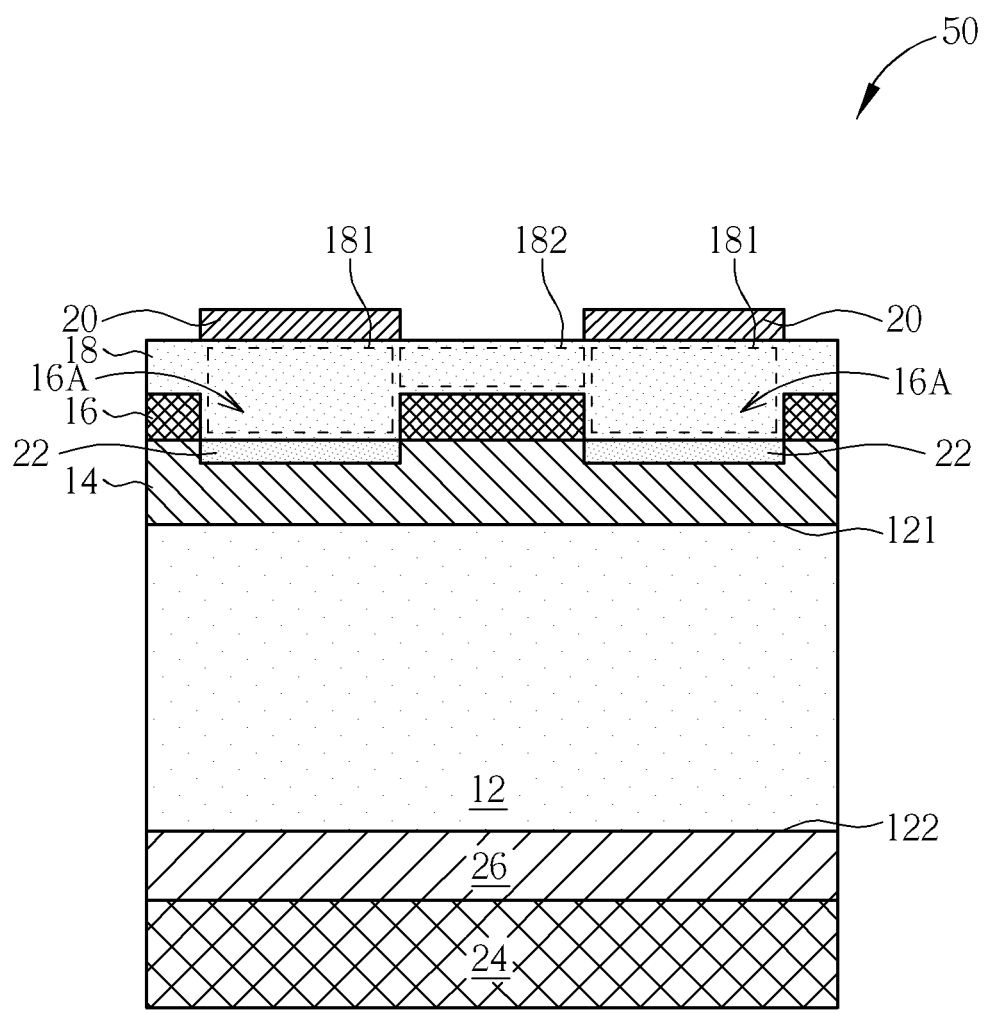
FIG. 3 illustrates a schematic diagram of a solar cell according to a third exemplary embodiment of the present disclosure.

Please refer to FIG. 3. FIG. 3 illustrates a schematic diagram of a solar cell according to a third exemplary embodiment of the present disclosure. As shown in FIG. 3, different from the first exemplary embodiment and the second exemplary embodiment, in this exemplary embodiment, the solar cell 50 excludes the protective layer 28, the first electrode layer 20 is contacted with a part of the second doped semiconductor layer 18, and other part of the second doped semiconductor layer 18 is exposed.

Figure 4:
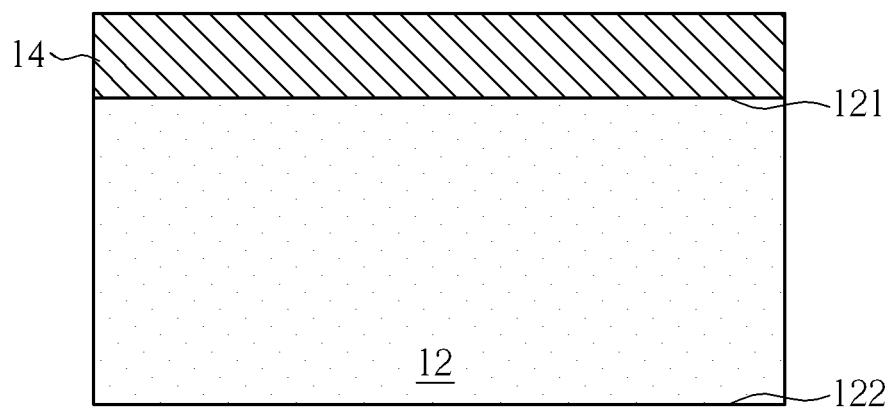
FIG. 4-FIG. 8 illustrate schematic diagrams of a method of forming a solar cell according to an exemplary embodiment of the present disclosure.

Please refer to FIG. 4-FIG. 8. FIG. 4-FIG. 8 illustrate schematic diagrams of a method of forming a solar cell according to an exemplary embodiment of the present disclosure. As shown in FIG. 4, at first, a semiconductor base 12 with a first doped type is provided. The semiconductor base 12 may be a crystalline silicon base such as a single crystalline silicon base, but not limited thereto. Next, a first doped semiconductor layer 14 is formed on a first surface 121 of the semiconductor base 12, and the first doped semiconductor layer 14 has a second doped type contrary to the first doped type. The material of the first doped semiconductor layer 14 may include crystalline silicon such as microcrystalline silicon, or amorphous silicon, but not limited thereto. In this exemplary embodiment, the first doped type can be P type, while the second doped type is N type, but not limited thereto, that is, the first doped type can also be N type, while the second doped type is P type. In this exemplary embodiment, the first doped semiconductor layer 14 may be formed by performing a diffusion process with introducing gas such as phosphoryl chloride ($POCl_3$) during the diffusion process, but not limited thereto. The processing temperature of the diffusion process is preferably and substantially between 800° C. and 900° C., e.g. about 850° C., but not limited thereto.

Figure 5:
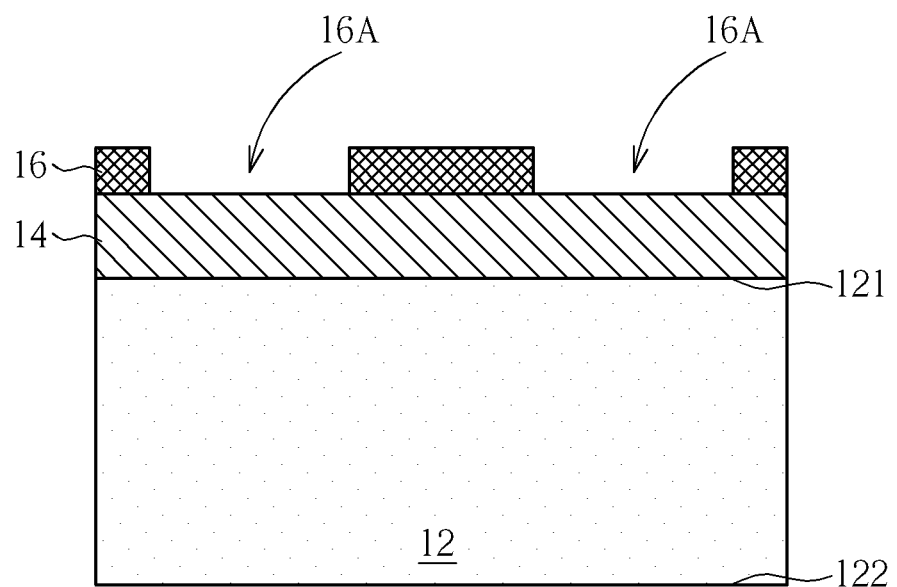

As shown in FIG. 5, an insulating layer 16 is then formed on the first doped semiconductor layer 14, and the insulating layer 16 has at least one opening 16A, which partially exposes the first doped semiconductor layer 14. The structure and the material of the insulating layer 16 could be selected referring to the previous detailed exemplary embodiment. The insulating layer 16 may be formed by means of plasma enhanced chemical vapor disposition (PECVD), and the at least one opening 16A of the insulating layer 16 could be formed by means of any kinds of patterning process such as etching process or laser process, but not limited thereto. For example, the insulating layer 16 could also be formed by screen printing process or inject printing process.

Figure 6:
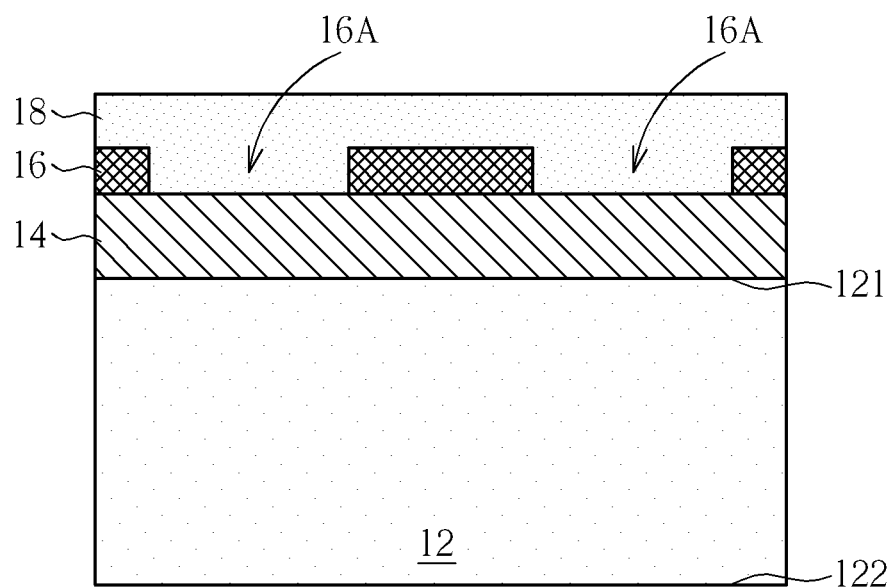

As shown in FIG. 6, a second doped semiconductor layer 18 is subsequently formed on the insulating layer 16 and on the first doped semiconductor layer 14 exposed by the at least one opening 16A of the insulating layer 16. Preferably, the second doped semiconductor layer 18 is covering on the insulating layer 16 and on the first doped semiconductor layer 14 exposed by the at least one opening 16A of the insulating layer 16. The second doped semiconductor layer 18 has the second doped type, and the dopant concentration of the second doped semiconductor layer 18 is substantially higher than (or namely substantially greater than) the dopant concentration of the first doped semiconductor layer 14. The material of the second doped semiconductor layer 18 may include amorphous silicon or nano crystalline silicon, and the absorption ratio of visible-light having wavelength substantially between 400 nm and 700 nm of the second doped semiconductor layer 18 is substantially between 20% and 100%.

Figure 7:
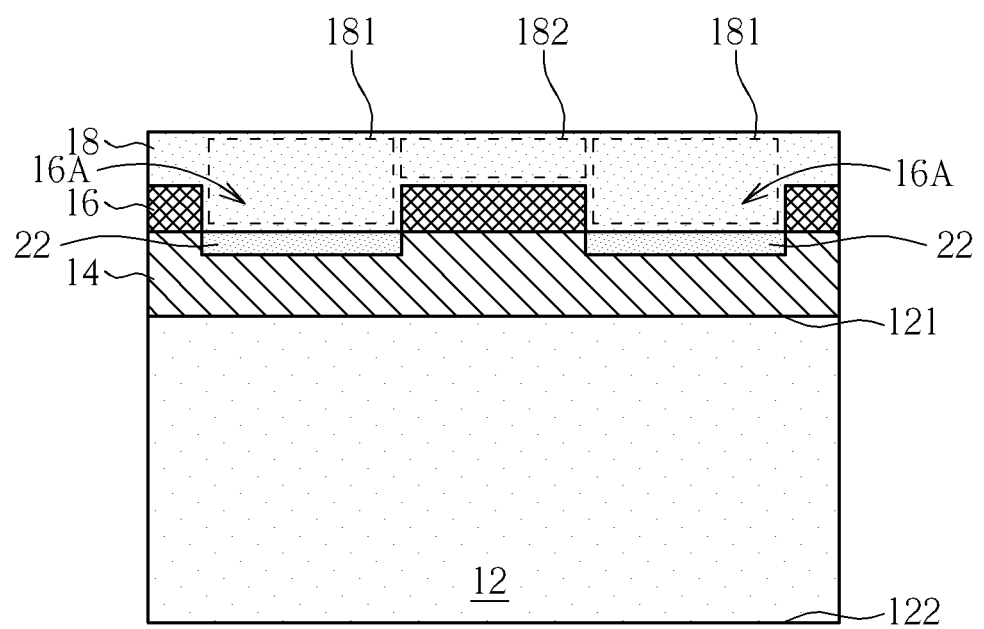

As shown in FIG. 7, an annealing process is then performed to diffuse the dopant of the second doped semiconductor layer 18 downward into the part of the first doped semiconductor layer 14 exposed by the at least one opening 16A of the insulating layer 16 to form at least one doped contact region 22 in the first doped semiconductor layer 14 exposed by the at least one opening 16A of the insulating layer 16. The annealing process of this exemplary embodiment is preferably a low temperature annealing process, and the processing temperature is about between 400° C. and 850° C., and is preferably substantial lower than the processing temperature of the diffusion process during the formation of the first doped semiconductor layer 14 to prevent adverse effect on the formed first doped semiconductor layer 14. The absorption ratio of visible-light having wavelength substantially between 400 nm and 700 nm of the second doped semiconductor layer 18 is substantially between 20% and 100%. In other words, the second doped semiconductor layer 18 has a high absorption ratio and a low reflective index with respect to short-wavelength visible-light, accordingly, the second doped semiconductor layer 18 is favorable for increasing a current density of the solar cell. Additionally, in this exemplary embodiment, the second doped semiconductor layer 18 is also served as a dopant source layer of the at least one doped contact region 22, accordingly, extra dopant source layer is unnecessary for the formation of the at least one doped contact region 22, and the process steps can be simplified and the alignment concern can be avoided. Furthermore, the second doped semiconductor layer 18 includes hydrogen for protecting the at least one doped contact region 22 and the semiconductor base 12 located below and depressing the generation of interface traps between the at least one doped contact region 22 and the semiconductor base 12. Moreover, the at least one opening 16A of the insulating layer 16 could be used to define the location of the at least one doped contact region 22. Also, the insulating layer 16 has protection function for it is capable of depressing the generation of interface traps between the first doped semiconductor layer 14 and the semiconductor base 12 and further reducing the recombination of electron-hole pairs. The at least one doped contact region 22 has the second doped type, and the dopant concentration of the at least one doped contact region 22 is substantially higher than the dopant concentration of the first doped semiconductor layer 14 and the dopant concentration of the second doped semiconductor layer 18, therefore, the at least one doped contact region 22 may serve as a selective emitter to reduce a contact resistance between the first doped semiconductor layer 14 and the second doped semiconductor layer 18 for improving the photo-electric (or namely power) conversion efficiency of the solar cell. It is appreciated that, because the materials of the insulating layer 16 and the second doped semiconductor layer 18 are different, in the annealing process, the thermal transfer efficiency between the first doped semiconductor layer 14 and the second doped semiconductor layer 18 is substantially different from the thermal transfer efficiency between the first doped semiconductor layer 14 and the insulating layer 16. Accordingly, after the annealing process, a first region 181 and a second region 182 are formed in the second doped semiconductor layer 18, where the first region 181 is corresponding to the at least one doped contact region 22, and the second region 182 is corresponding to the insulating layer 16. The grain size of the second doped semiconductor layer 18 in the first region 181 is substantially different from the grain size of the second doped semiconductor layer 18 in the second region 182, while the crystalline type of the second doped semiconductor layer 18 in the first region 181 and the crystalline type of the second doped semiconductor layer 18 in the second region 182 may be substantially the same or different. The relation of the grain size or the crystalline type between the second doped semiconductor layer 18 in the first region 181 and the second doped semiconductor layer 18 in the second region 182 has been illustrated in the previous detailed exemplary embodiment.

Figure 8:
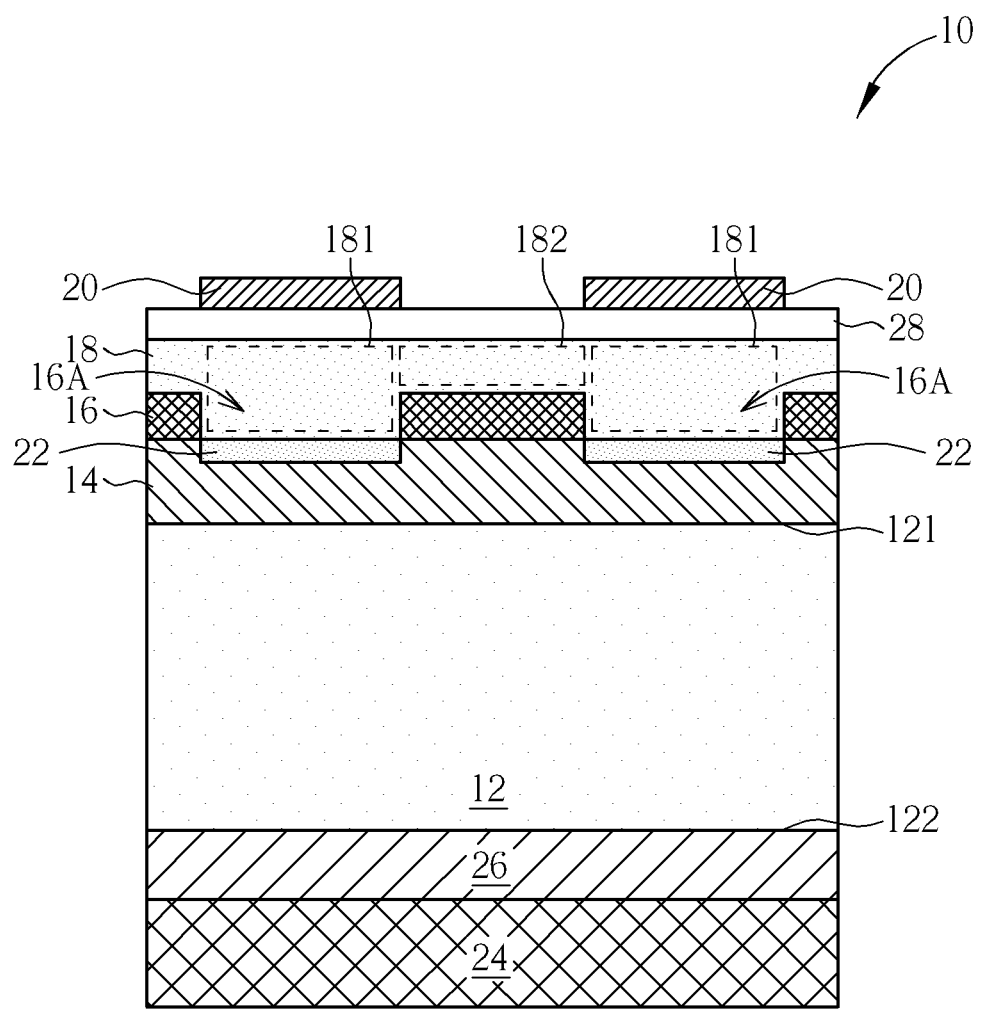

As shown in FIG. 8, a protective layer 28 is then formed on the second doped semiconductor layer 18, and a first electrode layer 20 corresponding to the at least one doped contact region 22 is formed. Furthermore, a second electrode layer 24 is formed on the second surface 122 of the semiconductor base 12, and a back side field (BSF) structure 26 may be selectively disposed between the second electrode layer 24 and the semiconductor base 12. The structures and the materials of the first electrode layer 20 and the second electrode layer 24 could both be selected referring to the previous detailed exemplary embodiment. The structure and the material of the back side field (BSF) structure 26 could be selected referring to the previous detailed exemplary embodiment. In this exemplary embodiment, the protective layer 28 is a transparent conducting layer, and the material of the protective layer 28 could be selected referring to the previous detailed exemplary embodiment. For instance, the protective layer 28 may be indium tin oxide (ITO). Accordingly, the solar cell 10 of the first exemplary embodiment of the present disclosure is fabricated. It is appreciated that, if the solar cell 40 (as shown in FIG. 2) of the second exemplary embodiment of the present disclosure is to be fabricated, the protective layer 28 could be made of insulating material, and the protective layer 28 includes at least one opening 28A (please refer to the second exemplary embodiment) exposing the first electrode layer 20. Moreover, if the solar cell 50 (as shown in FIG. 3) of the third exemplary embodiment of the present disclosure is to be fabricated, the steps of forming the protective layer 28 could be omitted.

Figure 9:
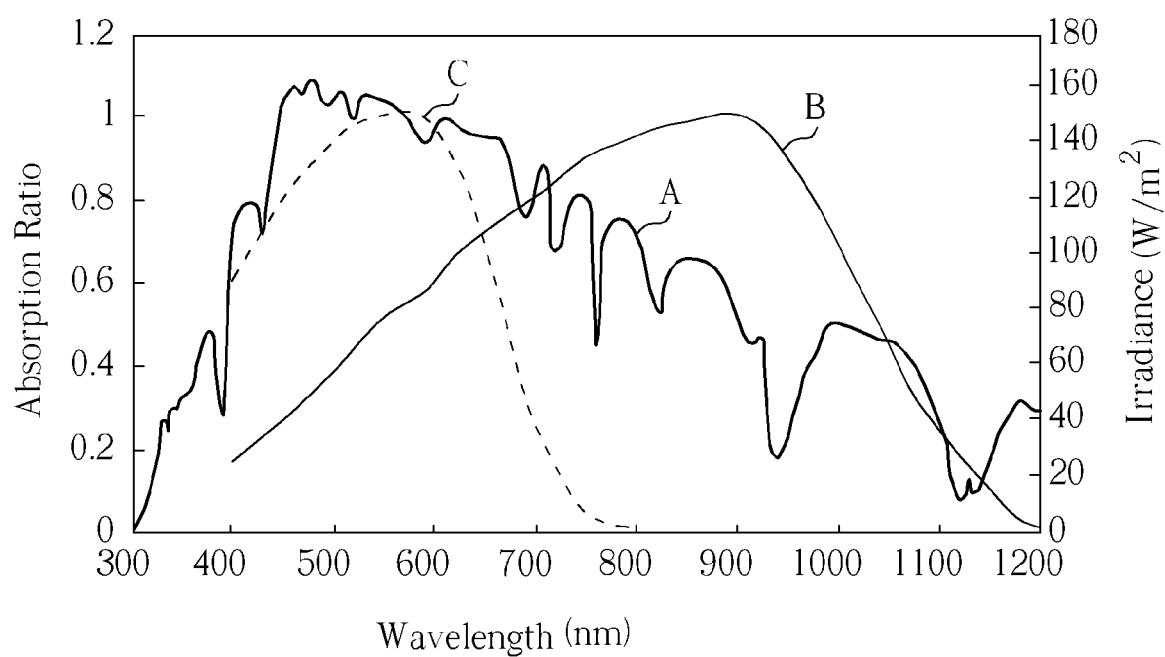
FIG. 9 illustrates a spectrum of sunlight and a relation between an absorption ratio and wavelength for crystalline silicon and amorphous silicon.

Please refer to FIG. 9. FIG. 9 illustrates a spectrum of sunlight and a relation between an absorption ratio and wavelength for crystalline silicon and amorphous silicon. Curve A shows an irradiance of the short-wavelength visible-light having wavelength substantially between 400 nm and 700 nm is higher than an irradiance of the long-wavelength invisible-light having wavelength over 700 nm irradiated by the sun. Curve B shows the low short-wavelength visible-light absorption ratio of crystalline silicon when the wavelength of sunlight is substantially between 400 nm and 700 nm. Curve C shows the short-wavelength visible-light absorption ratio of amorphous silicon is substantially between 20% and 100% when the wavelength of sunlight is substantially between 400 nm and 700 nm. The short-wavelength visible-light absorption ratio of amorphous silicon is obviously higher than the short-wavelength visible-light absorption ratio of crystalline silicon. Consequently, in the present disclosure, the second doped semiconductor layer is preferably made of amorphous silicon for increasing the absorption ratio of short-wavelength visible-light having wavelength substantially between 400 nm and 700 nm and further improving the photo-electric (or namely power) conversion efficiency of the solar cell.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A solar cell, comprising:
   a semiconductor base having a first surface and a second surface, wherein the semiconductor base has a first doped type;
   a first doped semiconductor layer disposed on the first surface of the semiconductor base, wherein the first doped semiconductor layer comprises at least one doped contact region and a doped non-contact region under the insulating layer, both of the doped non-contact region and the at least one doped contact region have a second doped type contrary to the first doped type, a dopant concentration of the doped non-contact region is greater than zero, and a dopant concentration of the at least one doped contact region is higher than the dopant concentration of the doped non-contact region;
   an insulating layer disposed on the first doped semiconductor layer, wherein the insulating layer has at least one opening exposing the at least one doped contact region;
   a second doped semiconductor layer disposed on the insulating layer and the at least one doped contact region, wherein the second doped semiconductor layer has the second doped type, and a dopant concentration of the second doped semiconductor layer is between the dopant concentration of the at least one doped contact region and the dopant concentration of the first doped semiconductor layer; and a first electrode layer disposed on the second doped semiconductor layer, wherein the first electrode layer is corresponding to the at least one doped contact region.

2. The solar cell of claim 1, wherein a material of the first doped semiconductor layer and a material of the at least one doped contact region comprise crystalline silicon.

3. The solar cell of claim 1, wherein the second doped semiconductor layer comprises a first region and a second region, the first region is corresponding to the at least one doped contact region of the first doped semiconductor layer, the second region is corresponding to the insulating layer, and a grain size of the second doped semiconductor layer in the first region is different from a grain size of the second doped semiconductor layer in the second region.

4. The solar cell of claim 1, wherein the second doped semiconductor layer comprises a first region and a second region, the first region is corresponding to the at least one contact region of the first doped semiconductor layer, the second region is corresponding to the insulating layer, and a crystalline type of the second doped semiconductor layer in the first region is different from a crystalline type of the second doped semiconductor layer in the second region.

5. The solar cell of claim 1, wherein an absorption ratio of visible-light having wavelength between 400 nanometer (nm) and 700 nm of the second doped semiconductor layer is between 20% and 100%.

6. The solar cell of claim 1, further comprising a protective layer disposed between the second doped semiconductor layer and the first electrode layer.

7. The solar cell of claim 6, wherein the protective layer has at least one opening exposing the first electrode layer.

8. The solar cell of claim 1, further comprising a second electrode layer disposed on the second surface of the semiconductor base.

9. A method of forming a solar cell, comprising:
providing a semiconductor base, wherein the semiconductor base has a first doped type;
forming a first doped semiconductor layer on a first surface of the semiconductor base, wherein the first doped semiconductor layer has a second doped type contrary to the first doped type;
forming an insulating layer on the first doped semiconductor layer, wherein the insulating layer has at least one opening partially exposing the first doped semiconductor layer;
forming a second doped semiconductor layer on the insulating layer and the first doped semiconductor layer exposed by the opening of the insulating layer, wherein the second doped semiconductor layer has the second doped type, and a dopant concentration of the second doped semiconductor layer is substantially higher than a dopant concentration of the first doped semiconductor layer;

performing an annealing process to diffuse the dopant of the second doped semiconductor layer downward to form at least one doped contact region in the first doped semiconductor layer exposed by the at least one opening of the insulating layer, wherein the at least one doped contact region has the second doped type, a dopant concentration of the at least one doped contact region is substantially higher than the dopant concentration of the first doped semiconductor layer, and the dopant concentration of the at least one doped contact region is substantially higher than the dopant concentration of the second doped semiconductor layer; and forming a first electrode layer on the second doped semiconductor layer, wherein the first electrode layer is corresponding to the at least one doped contact region.

10. The method of forming the solar cell of claim 9, wherein a material of the first doped semiconductor layer and a material of the at least one doped contact region comprise crystalline silicon.

11. The method of forming the solar cell of claim 9, wherein a material of the second doped semiconductor layer comprises amorphous silicon before the annealing process is performed.

12. The method of forming the solar cell of claim 11, wherein a first region and a second region are formed in the second doped semiconductor layer after the annealing process is performed, the first region is corresponding to the at least one doped contact region of the first doped semiconductor layer, the second region is corresponding to the insulating layer, and a grain size of the second doped semiconductor layer in the first region is substantially different from a grain size of the second doped semiconductor layer in the second region.

13. The method of forming the solar cell of claim 11, wherein a first region and a second region are formed in the second doped semiconductor layer after the annealing process is performed, the first region is corresponding to the at least one doped contact region of the first doped semiconductor layer, the second region is corresponding to the insulating layer, and a crystalline type of the second doped semiconductor layer in the first region is substantially different from a crystalline type of the second doped semiconductor layer in the second region.

14. The method of forming the solar cell of claim 9, wherein an absorption ratio of visible-light having wavelength substantially between 400 nanometer (nm) and 700 nm of the second doped semiconductor layer is substantially between 20% and 100%.

15. The method of forming the solar cell of claim 9, further comprising forming a protective layer between the second doped semiconductor layer and the first electrode layer.

16. The method of forming the solar cell of claim 15, wherein the protective layer has at least one opening exposing the first electrode layer.

17. The method of forming the solar cell of claim 9, further comprising forming a second electrode layer on a second surface of the semiconductor base.

* * * * *